United States Patent [19]
Rybicki

[11] Patent Number: 4,691,125
[45] Date of Patent: Sep. 1, 1987

[54] ONE HUNDRED PERCENT DUTY CYCLE SAMPLE-AND-HOLD CIRCUIT

[75] Inventor: Mathew A. Rybicki, Austin, Tex.

[73] Assignee: Motorola, Inc., Schaumburg, Ill.

[21] Appl. No.: 915,837

[22] Filed: Oct. 3, 1986

[51] Int. Cl.[4] .............................................. G11C 27/02
[52] U.S. Cl. .................................... 307/353; 307/491; 328/151
[58] Field of Search ............... 307/352, 353, 491, 494; 328/151

[56] References Cited

U.S. PATENT DOCUMENTS 4,404,479 9/1983 Toyomaki ............................ 307/353
4,439,693 3/1984 Lucas et al. .......................... 307/353
4,542,304 9/1985 Swanson ............................. 307/353
4,546,324 10/1985 Bingham et al. ..................... 307/353
4,570,080 2/1986 Swanson ............................. 307/353
4,585,956 4/1986 Lie ........................................ 307/353
4,587,443 5/1986 Van de Plassche ................ 307/353

FOREIGN PATENT DOCUMENTS

WO81/00928 4/1981 PCT Int'l Appl. ................ 307/353

*Primary Examiner*—John Zazworsky
*Attorney, Agent, or Firm*—John A. Fisher; Jeffrey Van Myers; Robert L. King

[57] ABSTRACT

A switched capacitor sample-and-hold circuit which compensates offset voltage error and switch feedthru error while having a one hundred percent duty cycle is provided. Two amplifiers are utilized. A first operational amplifier is disconnected from a second operational amplifier while being autozeroed. An input voltage is sampled onto an input capacitor. The input capacitor is disconnected from the input voltage and then coupled to the second operational amplifier which is in a unity gain configuration. After the sampled input voltage is charged onto an output load, the first operational amplifier is disconnected from the second operational amplifier and the sampling process is repeated. The second operational amplifier is also offset voltage compensated by the first operational amplifier.

9 Claims, 4 Drawing Figures

ONE HUNDRED PERCENT DUTY CYCLE SAMPLE-AND-HOLD CIRCUIT

TECHNICAL FIELD

This invention relates generally to switched capacitor amplifier circuits, and more particularly, to electronic sample-and-hold circuits.

BACKGROUND ART

Circuits which receive and store an input voltage are commonly referred to as sample-and-hold circuits. Many of these types of circuits have a nonvalid period of operation when an input voltage is being sampled and stored and a valid period of operation when the most recently sampled value is outputted. A disadvantage with this type of circuit operation is that many applications require an output voltage to be constantly present. Since input voltages are sampled and held by charge storage devices, most sample-and-hold circuits utilize capacitors in conjunction with transistor amplifiers as shown in U.S. Pat. No. 4,542,304 entitled "Switched Capacitor Feedback Sample-and-Hold Circuit" by Eric Swanson and U.S. Pat. No. 4,585,956 also entitled "Switched Capacitor Feedback Sample-and-Hold Circuit" by Hans Lie. In each of these teachings, a constant output voltage is provided which is commonly referred to as a one hundred percent duty cycle output. However, previous sample-and-hold circuits have had offset voltage and/or switch feedthru errors associated with the output voltage. Error voltages resulting from inherent offset voltage of a differential amplifier distort the accuracy of an output voltage sample. Previous sample-and-hold circuits typically also have an undesirably long sample period which unnecessarily commits circuitry providing the sampled voltage to maintain the sample. Other disadvantages with known sample-and-hold circuits include unsatisfactory power supply rejection (PSR) performance.

BRIEF DESCRIPTION OF THE INVENTION

Accordingly, an object of the present invention is to provide an improved sample-and-hold circuit.

Another object of the present invention is to provide an improved one hundred percent duty cycle sample-and-hold circuit having compensation for both offset voltage and switch feedthru errors.

A further object of the present invention is to provide an improved sample-and-hold circuit having improved power supply rejection and a short sample period.

In carrying out the above and other objects of the present invention, there is provided, in one form, a sample-and-hold circuit having a differential amplifier. A first capacitor has a first electrode which receives and stores a sampled input voltage plus or minus an offset voltage of the differential amplifier. The differential amplifier has a first input coupled to a second electrode of the first capacitor, a second input coupled to a reference voltage, and an output. A first switch is coupled between the first input and output of the differential amplifier. A second capacitor has a first electrode coupled to the reference voltage terminal and a second electrode coupled to an input of a second amplifier at a node. In one form, the second amplifier may be implemented as a second differential amplifier. A second switch is coupled between the output of the first differential amplifier and the node connecting the second capacitor and input of the second amplifier. A third switch is coupled between the first electrode of the first capacitor and the output of the second amplifier. An output of the second amplifier continuously provides a substantially error-free output voltage of the time sampled input voltage.

These and other objects, features and advantages will be more clearly understood from the following detailed description taken in conjunction with the accompanying drawings.

DETAILED DESCRIPTION OF THE INVENTION

Figure 1:
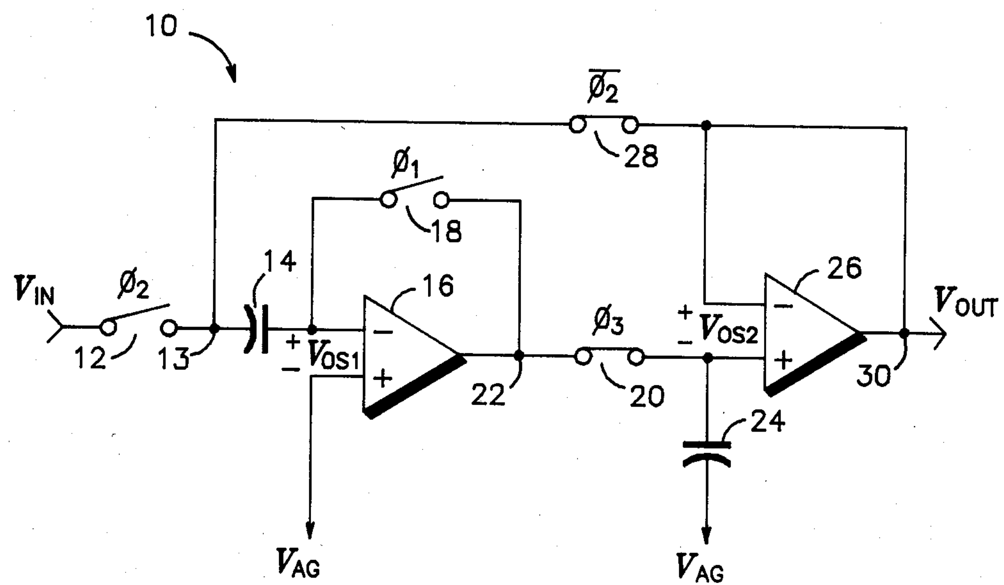
FIG. 1 illustrates in partial schematic form a sample-and-hold circuit in accordance with the present invention.

Shown in FIG. 1 is a sample-and-hold circuit 10 in accordance with the present invention. An input voltage $V_{IN}$ is coupled to a first terminal of a switch 12. A second terminal of switch 12 is connected to a first electrode of a capacitor 14 at a node 13. A control signal labeled $\phi_2$ is coupled to switch 12 for controlling switch 12. For purposes of illustration only, assume that all switches may be implemented with any type of switching device and that in the illustrated form a logic high control signal will make a switch conductive and a logic low control signal will make a switch nonconductive. A second electrode of capacitor 14 is connected to an inverting or negative input of an operational amplifier 16. A noninverting or positive input of operational amplifier 16 is connected to an analog voltage reference terminal labeled $V_{AG}$. Operational amplifier 16 has a first offset voltage, $V_{OS1}$, associated therewith. For purposes of illustration only, the polarity of offset voltage indicated in FIG. 1 has been arbitrarily chosen. A switch 18 has a first terminal connected to the noninverting input of operational amplifier 16, and a second terminal of switch 18 is connected to both an output of operational amplifier 16 and a first terminal of a switch 20 at a node 22. A control signal labeled $\phi_1$ is coupled to switch 18 for controlling switch 18. A second terminal of switch 20 is connected to both a first electrode of a capacitor 24 and a noninverting or positive input of an operational amplifier 26. A control signal labeled $\phi_3$ is coupled to switch 20 for controlling switch 20. A second electrode of capacitor 24 is connected to the analog ground voltage $V_{AG}$ reference terminal. A switch 28 has a first terminal connected to node 13, and a second terminal connected to both an inverting or negative input and an output of operational amplifier 26 at an output node 30 for providing an output voltage $V_{OUT}$. A complement of control signal $\phi_2$ is coupled to switch 28 for controlling switch 28. Operational amplifier 26 has a second offset voltage, $V_{OS2}$, associated therewith having a polarity as illustrated in FIG. 1. While sample-and-hold circuit 10 is preferably implemented with CMOS transistor technology, it should be clear that other types of transistors may be used to implement the present invention.

Figure 2:
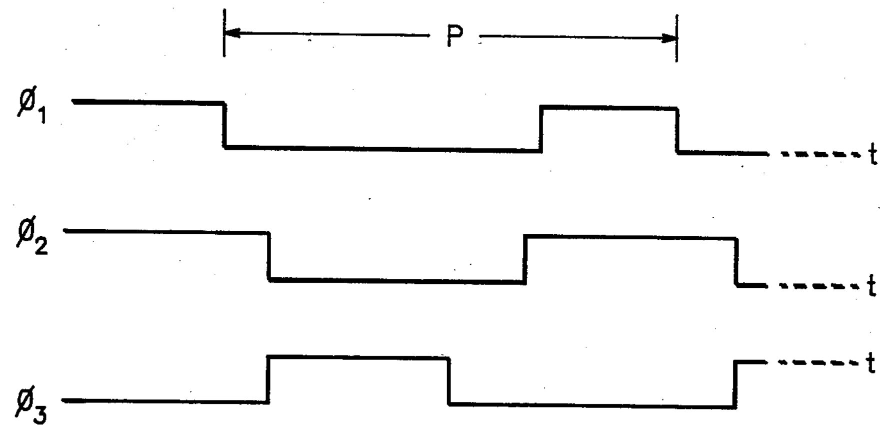
FIG. 2 illustrates in graphical form control signals associated with the circuit of FIG. 1.

In operation, consider one full clock cycle, P, of circuit operation. Referring to FIG. 2, assume that in a precondition mode clock signals $\phi_1$ and $\phi_2$ are at logic high states and clock signal $\phi_3$ is at a logic low state. Therefore, switches 12 and 18 are conductive, and switches 20 and 28 are nonconductive. In this switch configuration, operational amplifier 16 is configured in a unity gain mode which makes the negative input of operational amplifier 16 a low impedance node. As a result, whatever input voltage which is present at the first terminal of switch 12 is charged onto capacitor 14 minus an inherent offset voltage of operational amplifier 16 assuming $V_{OS1}$ has a polarity as indicated in FIG. 1. In the unity gain mode, switch 18 operates to make the output and negative input have equal voltage potential which is $V_{OS1}$ above $V_{AG}$. At the beginning of the first clock cycle period labeled in FIG. 2 by the letter "P", signal $\phi_1$ transitions to a low logic level which makes switch 18 nonconductive. At the point in time when switch 18 becomes nonconductive, the actual sample value of the input voltage is captured for an entire period P. Switch 12 remains conductive thereafter long enough for the input voltage at the negative input of operational amplifier 16 to settle from the switching action of switch 18. Once switch 18 is nonconductive and the negative input of operational amplifier 16 has settled, no further switch feedthru error can be coupled to the negative input of operational amplifier 16. Whatever input voltage was present at node 13 when switch 18 becomes nonconductive minus the offset voltage $V_{OS1}$ is charged onto capacitor 14. Near simultaneously, control signal $\phi_2$ transitions to a low logic level and control signal $\phi_3$ transitions to a high logic level. In response thereto, switch 12 becomes nonconductive and switches 20 and 28 become conductive. The output voltage sample stored on capacitor 14 is transfered to output terminal 30 to provide the output voltage $V_{OUT}$ which may be established on a resistive and/or capacitive load (not shown). The offset voltage of operational amplifier 16 is added to the stored input voltage which was decreased by the offset voltage so that the resulting output voltage equals the true value of the sampled input voltage. As a result of the negative feedback of the closed loop system, the output of operational amplifier 16 charges capacitor 24 to $V_{OUT}$ minus inherent offset voltage $V_{OS2}$ associated with operational amplifier 26 assuming the polarity of $V_{OS2}$ illustrated in FIG. 1. After capacitor 24 is charged by the output of operational amplifier 16 and the two amplifier system has had time to settle, clock signal $\phi_3$ transitions to a low logic level which disconnects capacitor 24 from operational amplifier 16. However, the output voltage is established on an output load and capacitor 24 maintains the output voltage minus offset voltage $V_{OS2}$ at the positive input of operational amplifier 26. Before the clock period P ends, signals $\phi_1$ and $\phi_2$ transition to a high logic level which makes switch 28 nonconductive and switches 12 and 18 conductive. In this form, operational amplifier 16 is completely disconnected from operational amplifier 26 which allows circuit 10 to sample a new input value to be outputted as the next output voltage $V_{OUT}$. After a new input voltage sample minus the offset voltage of operational amplifier 16 has been charged onto capacitor 14, a new clock period begins when signal $\phi_1$ transitions to a low logic level to make switch 18 nonconductive. The circuit operation then repeats as described above.

It should be apparent that a single input amplifier may be substituted for differential amplifier 26. If a single input amplifier is used, the single input is connected to the second terminal of switch 20 and the first electrode of capacitor 24. The output of the single input amplifier would be connected to only the second terminal of switch 28. The operation of the invention for a single input amplifier substitute would otherwise be substantially as described as above.

Figure 3:
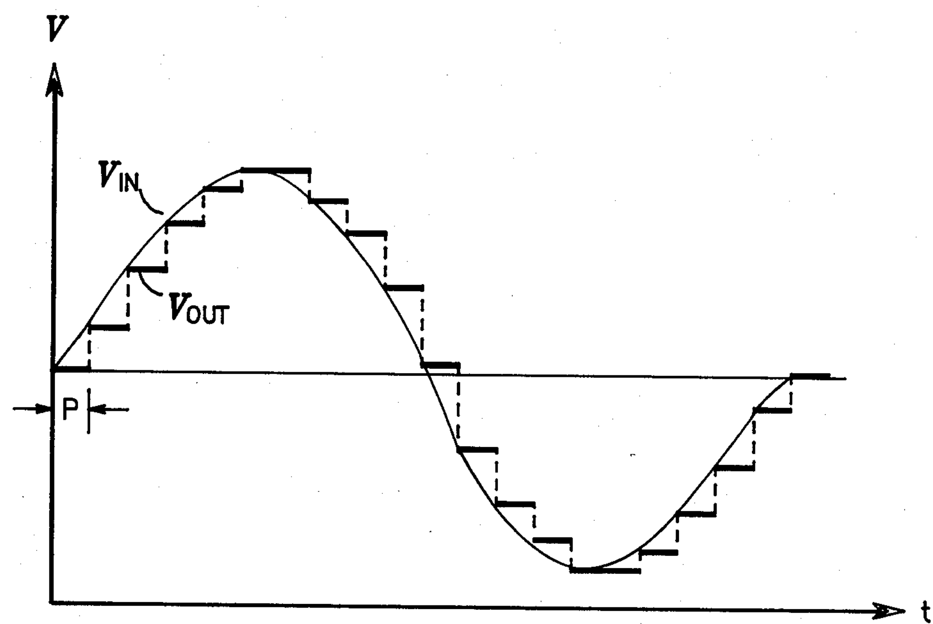
FIG. 3 illustrates in graphical form a voltage-time transfer function of the input and output voltages of the circuit of FIG. 1.

Shown in FIG. 3 is a graph illustrating a sampled output $V_{OUT}$ of a sinusoidal input voltage $V_{IN}$ illustrated by a dashed curve. One output voltage value is provided each clock sampling period P. In the illustrated form, each sampled value is shown by a horizontal value. It should be obvious that any type of input voltage waveform may be sampled and various sampling rates may be utilized.

Figure 4:
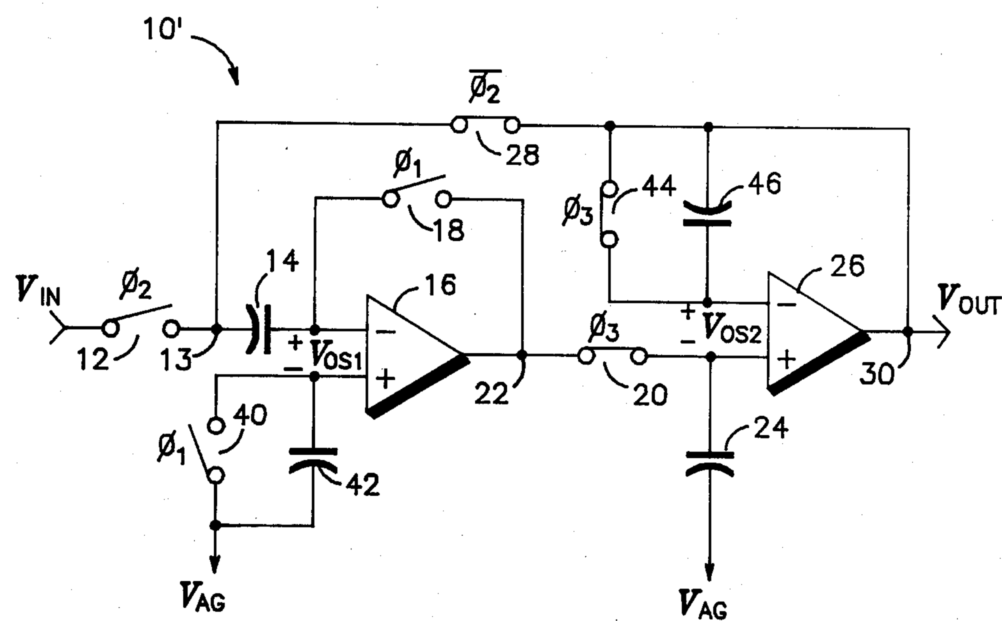
FIG. 4 illustrates in partial schematic form another embodiment of the present invention.

Shown in FIG. 4 is sample-and-hold circuit 10' which is a modification of sample-and-hold circuit 10 of FIG. 1. Sample-and-hold circuit 10' is designed to further reduce output voltage error resulting from any charge injection errors resulting from transistor switching action. For convenience of illustration, elements which are common with circuit 10 are identically numbered in both FIGS. 1 and 4. Additional elements shown in FIG. 4 include a switch 40 having a first terminal connected to the positive input of operational amplifier 16 and a second terminal connected to the analog ground reference terminal Control signal $\phi_1$ is connected to switch 40 for controlling switch 40. A capacitor 42 has a first electrode connected to the positive input of operational amplifier 16 and a second electrode connected to the analog ground reference terminal A switch 44 has a first terminal connected to the negative input of operational amplifier 26 and a second terminal connected to the second terminal of switch 28. Control signal $\phi_3$ is connected to switch 44 for controlling switch 44. A first electrode of a capacitor 46 is connected to the negative input of operational amplifier 26, and a second electrode of capacitor 46 is connected to both the second terminal of switch 28 and the output of operational amplifier 26 at output terminal 30.

In operation, when switches 18 and 20 are opened, parasitic overlap capacitance associated with the switches may couple an error voltage to the negative input of operational amplifier 16 and to the positive input of operational amplifier 26, respectively. Therefore, capacitor 42 is ratioed with capacitor 14 by a predetermined proportionality factor which is set so that the change in voltage at the negative input of operational amplifier 16 is equal to the change in voltage at the positive input of operational 16. Mathematically, the relationship can be expressed as:

$$\Delta V_+ = (\Delta Q_+)/C_+ = \Delta V_-$$

and $$\Delta V_- = (\Delta Q_-)/C_-.$$

Therefore, if the ratio of the total positive nodal capacitance, $C_+$, and total negative nodal capacitance, $C_-$, equals the ratio of the charge injected by switch 40, $\Delta Q_{30}$, into the positive input and the charge injected by switch 18, $\Delta Q_-$, into the negative input, an equal of amount of error voltage, $\Delta V_+$ and $\Delta V_-$, is coupled to each operational amplifier input and no output voltage error results. It should be apparent that the capacitive value ratio of capacitors 14 and 42 may be one to one or any other proportionality. Similarly, capacitor 46 is ratioed with capacitor 24 and switch 44 is ratioed to switch 20 so that the same amount of error voltage from the above-described switch feedthru error is coupled to both inputs of operational amplifier 26. Therefore the error voltage associated with conventional transistor switches is substantially eliminated and the output voltage is not distorted by operational amplifier offset voltage or transistor switch feedthru errors.

By now it should be apparent that a sample-and-hold circuit having a one hundred percent duty cycle and which substantially eliminates error voltages has been provided. By using two amplifier stages, the output voltage is continuously present and may be updated at high sampling rates. A very short sampling period is required so that circuitry which might provide the input voltage sample is not completely dedicated to the sample-and-hold circuit. The present invention also can provide excellent power supply rejection when the embodiment illustrated in FIG. 4 is used because of the fact that both inputs to differential amplifiers 16 and 26 are receiving the same amount of power supply noise coupled through the overlap capacitances of switches 18, 40 and 20, 44, respectively. The output is therefore unaffected. Conventional transistor switches may be used without creating error voltages due to a switch error compensation structure.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A sample-and-hold circuit comprising:

first charge storage means for receiving and storing an input voltage;

a first differential amplifier having a first input coupled to the first charge storage means, a second input coupled to a reference voltage terminal, and an output;

first switching means.,having a first terminal coupled to the first input of the first differential amplifier means, and a second terminal coupled to the output of the first differential amplifier means, for selectively connecting the first input and output of the first differential amplifier;

second charge storage means having a first electrode coupled to the reference voltage terminal, and a second electrode for selectively receiving and storing the output of the first differential amplifier;

second switching means having a first terminal coupled to the output of the first differential amplifier, and a second terminal coupled to the second electrode of the second charge storage means;

a second differential amplifier having a first input coupled to the second electrode of the second charge storage means, and a second input connected to an output thereof for continuously providing a sampled output voltage; and third switching means having a first terminal coupled to the first charge storage means, and a second terminal coupled to the second input of the second differential amplifier, for coupling the first charge storage means to the second differential amplifier.

2. The sample-and-hold circuit of claim 1 further comprising:

third charge storage means having a first electrode coupled to the second terminal of the third switching means, and a second electrode coupled to the second input of the second differential amplifier; and fourth switching means having a first terminal coupled to the second terminal of the third switching means, and a second terminal coupled to the second input of the second differential amplifier.

3. The sample-and-hold circuit of claim 2 further comprising:

.fifth switching means having a first terminal coupled to the input voltage, and a second terminal coupled to the first charge storage means.

4. The sample-and-hold circuit of claim 3 further comprising:

sixth switching means having a first terminal coupled to the reference voltage terminal, and a second terminal coupled to the second input of the first differential amplifier; and fourth charge storage means having a first electrode coupled to the reference voltage terminal, and a second electrode coupled to the second input of the first differential amplifier.

5. The sample-and hold circuit of claim 4 wherein the first and sixth switching means are controlled by a first control signal, the third and fifth switching means are controlled by a second control signal, and the second and fourth switching means are controlled by a third control signal.

6. A sample-and-hold circuit comprising:

first charge storage means for receiving and storing an input voltage;

a differential amplifier having a first input coupled to the first charge storage means, a second input coupled to a reference voltage terminal, and an output;

first switching means having a first terminal coupled to the first input of the differential amplifier means, and a second terminal coupled to the output of the differential amplifier means, for selectively connecting the first input and output of the differential amplifier;

second charge storage means having a first electrode coupled to the reference voltage terminal, and a second electrode for selectively receiving and storing the output of the differential amplifier;

second switching means having a first terminal coupled to the output of the differential amplifier, and a second terminal coupled to the second electrode of the second charge storage means;

an output amplifier having an input coupled to both the second electrode of the second charge storage means and the second terminal of the second switching means, and an output for continuously providing a sampled output voltage; and third switching means having a first terminal coupled to the first charge storage means, and a second terminal coupled to the output of the output amplifier, for coupling the first charge storage means to the output amplifier.

7. The sample-and-hold circuit of claim 6 further comprising:

fourth switching means having a first terminal coupled to the input voltage, and a second terminal coupled to the first charge storage means.

8. A sample-and-hold circuit comprising:

a first capacitor having first and second electrodes, the first capacitor receiving and storing an input voltage;

a first differential amplifier having a first input coupled to the second electrode of the first capacitor, a second input coupled to a reference voltage, and an output;

a first switch having a first terminal coupled to the first input of the first differential amplifier, a second terminal coupled to the output of the first differential amplifier, and a control terminal for receiving a first control signal;

a second switch having a first terminal coupled to the output of the first differential amplifier, a second terminal, and a control terminal for receiving a second control signal;

a second capacitor having a first electrode coupled to the second terminal of the second switch, and a second electrode coupled to the reference voltage;

a second differential amplifier having a first input coupled to the first electrode of the second capacitor, and a second input coupled to an output thereof for providing a sampled output voltage; and a third switch having a first terminal coupled to the first electrode of the first capacitor, a second terminal coupled to the output of the second input of the second differential amplifier, and a control terminal for receiving a third control signal.

9. The sample-and-hold circuit of claim 8 further comprising:

a fourth switch having a first terminal coupled to the first electrode of the first capacitor, a second terminal coupled to the input voltage, and a control terminal coupled to a complement of the third control signal.

* * * * *